(12) United States Patent
Zhang et al.

(10) Patent No.: US 10,978,509 B2
(45) Date of Patent: Apr. 13, 2021

(54) DISPLAY PANEL AND MANUFACTURING METHOD THEREOF

(71) Applicant: WUHAN CHINA STAR OPTOELECTRONICS TECHNOLOGY CO., LTD., Wuhan (CN)

(72) Inventors: Guiyang Zhang, Wuhan (CN); Guowei Zha, Wuhan (CN)

( * ) Notice: Subject to any disclaimer, the term of this patent is extended or adjusted under 35 U.S.C. 154(b) by 0 days.

(21) Appl. No.: 16/475,135

(22) PCT Filed: Apr. 17, 2019

(86) PCT No.: PCT/CN2019/083025
§ 371 (c)(1),
(2) Date: Jul. 1, 2019

(87) PCT Pub. No.: WO2020/133816
PCT Pub. Date: Jul. 2, 2020

(65) Prior Publication Data
US 2020/0251523 A1 Aug. 6, 2020

(30) Foreign Application Priority Data
Dec. 29, 2018 (CN) .......................... 201811644935.8

(51) Int. Cl.
*H01L 27/15* (2006.01)
*H01L 33/00* (2010.01)
*H01L 33/46* (2010.01)
*H01L 33/50* (2010.01)

(52) U.S. Cl.
CPC ........ *H01L 27/156* (2013.01); *H01L 33/0095* (2013.01); *H01L 33/46* (2013.01); *H01L 33/50* (2013.01); *H01L 2933/0041* (2013.01)

(58) Field of Classification Search
CPC ............... H01L 25/0753; H01L 27/156; H01L 2933/0041; H01L 33/0095; H01L 33/46; H01L 33/50; H01L 33/60
USPC .......................................................... 257/79
See application file for complete search history.

(56) References Cited

U.S. PATENT DOCUMENTS

| 2010/0060822 | A1* | 3/2010 | Sun ................... G02F 1/133617 349/71 |
| 2017/0010229 | A1* | 1/2017 | Moritz ............... G01N 33/6848 |
| 2017/0343859 | A1* | 11/2017 | Chen ................. G02F 1/133617 |
| 2018/0067363 | A1 | 3/2018 | Li et al. |

(Continued)

FOREIGN PATENT DOCUMENTS

| CN | 101226869 A | 7/2008 |
| CN | 203275836 U | 11/2013 |

(Continued)

*Primary Examiner* — Long K Tran

(57) ABSTRACT

The present invention provides a display panel and a method of manufacturing the same. The display panel employs a target light transmission layer disposed on a target light conversion layer for transmitting the target light generated by the target light conversion layer and reflecting the excitation light passing through the target light conversion layer, such that the target light emitted by the sub-pixel units is mixed with a small amount of excitation light or even without excitation light, so that the target light emitted by the sub-pixel units is relatively pure, thereby solving the technical problem that the existing micro-display technology has defects.

20 Claims, 4 Drawing Sheets

(56) References Cited

U.S. PATENT DOCUMENTS

2018/0348421 A1     12/2018   Kim et al.
2019/0237706 A1      8/2019   Jin et al.

FOREIGN PATENT DOCUMENTS

| | | |
|---|---|---|
| CN | 104752620 A | 7/2015 |
| CN | 105044975 A | 11/2015 |
| CN | 105589250 A | 5/2016 |
| CN | 106526965 A | 3/2017 |
| CN | 108172608 A | 6/2018 |
| CN | 108257949 A | 7/2018 |

\* cited by examiner

DISPLAY PANEL AND MANUFACTURING METHOD THEREOF

BACKGROUND OF INVENTION

Field of Invention

The present invention relates to a field of display technology, and in particular, to a display panel and a method of manufacturing the same.

Description of Prior Art

Liquid crystal displays (LCDs) and organic light-emitting diode (OLED) displays, as mainstream display devices, each have their own advantages and disadvantages that an LCD has a low light utilization rate and relatively low resolution, while an OLED has a short service life and low brightness. Accordingly, it is needed to develop a display device having better comprehensive effects, such as a quantum dot light emitting diode (QLED), and a mini-light emitting diode (mini-LED), and develop ultimate micro-display technology, such as a micro-light emitting diode (micro-LED).

Micro-LEDs have advantages of high luminous efficiency, low power consumption, high color gamut, a long service life, and good stability. At present, the micro-LEDs are roughly divided into two types. One is a micro-LED having sub-pixels in three colors of red, green, and blue (RGB). However, when it is transferred to a drive substrate, transfer efficiency is low. The other one is shown in FIG. 1, wherein a near-ultraviolet micro-light-emitting diode is used, and a light conversion layer is disposed on a light source to convert near-ultraviolet light into red, green, and blue light. This method is easier to implement, but will cause mix of red, green, and blue light with near-ultraviolet light, resulting in low color saturation, and color crosstalk is likely to occur between sub-pixel units due to their large light exiting angles.

Therefore, the existing micro display technology has defects and needs to be improved.

SUMMARY OF INVENTION

In order to solve the technical problems of the existing micro-display technology, the present invention provides a display panel and a method of manufacturing the same.

To solve the above problems, the technical solution provided by the present invention is as follows.

An embodiment of the present invention provides a display panel including a plurality of sub-pixel units, at least a portion of the sub-pixel units including: an excitation light source for generating an excitation light; a target light conversion layer disposed in a light exiting direction of the excitation light source for converting the excitation light into a target light; and a target light transmission layer disposed in a light exiting direction of the target light conversion layer for transmitting the target light generated by the target light conversion layer and reflecting the excitation light passing through the target light conversion layer.

In the display panel provided by the present invention, the target light transmission layer is formed on a light exiting surface of the target light conversion layer, and the excitation light passing through the target light conversion layer is reflected to the target light conversion layer.

In the display panel provided by the present invention, an excitation light transmission layer is further included, wherein the excitation light transmission layer is disposed in the light exiting direction of the excitation light source and is disposed between the excitation light source and the target light conversion layer.

In the display panel provided by the present invention, the excitation light transmission layer is formed on a light exiting surface of the excitation light source.

In the display panel provided by the present invention, the target light conversion layer is formed on the light exiting surface of the excitation light transmission layer.

In the display panel provided by the present invention, the excitation light transmission layer, the target light conversion layer, and the target light transmission layer have a total thickness of 200 nm to 500 nm.

In the display panel provided by the present invention, a light converging layer is further included and disposed between the adjacent sub-pixel units for converging the target light emitted by the sub-pixel units.

In the display panel provided by the present invention, the light converging layer laterally surrounds the sub-pixel units.

In the display panel provided by the present invention, the light converging layer laterally surrounds the target light conversion layer and the target light transmission layer.

In the display panel provided by the present invention, the light converging layer laterally surrounds the excitation light transmission layer, the target light conversion layer, and the target light transmission layer.

Another embodiment of the present invention further provides a method of manufacturing a display panel, including: providing a substrate; forming a driving circuit layer for sub-pixel units on the substrate; forming a fixing member for the sub-pixel units on the driving circuit layer; fixing an excitation light source for generating an excitation light in the fixing member; forming a target light conversion layer in a light exiting direction of at least a portion of the excitation light source for converting the excitation light into a target light; forming a target light transmission layer in a light exiting direction of the target light conversion layer for transmitting the target light generated by the light conversion layer and reflecting the excitation light passing through the target light conversion layer; and forming a protective layer on the target light transmission layer to obtain the display panel.

In the method of manufacturing the display panel of the present invention, the step of forming the target light transmission layer in the light exiting direction of the target light conversion layer includes forming a target light transmission layer on a light exiting surface of the target light conversion layer.

The method of manufacturing the display panel of the present invention further includes forming an excitation light transmission layer in a light exiting direction of the excitation light source.

In the method of manufacturing the display panel of the present invention, the step of forming the excitation light transmission layer in the light exiting direction of the excitation light source includes forming the excitation light transmission on a light exiting surface of the excitation light source.

The method of manufacturing the display panel of the present invention further includes forming the target light conversion layer on a light exiting surface of the excitation light transmission layer.

In the method of manufacturing the display panel of the present invention, the step of forming the excitation light transmission layer in the light exiting direction of the excitation light source includes: forming the excitation light transmission layer by depositing an inorganic material on the light exiting surface of the excitation light source by evaporation.

The method of manufacturing the display panel of the present invention includes forming a light converging layer between adjacent sub-pixel units for converging light emitted by the sub-pixel units.

In the method of manufacturing the display panel of the present invention, the step of forming the light converging layer between adjacent sub-pixel units includes forming the light converging layer laterally surrounding the sub-pixel units.

In the method of manufacturing the display panel of the present invention, the step of forming the light converging layer between adjacent sub-pixel units includes the light converging layer laterally surrounds the target light conversion layer and the target light transmission layer.

In the method of manufacturing the display panel of the present invention, the step of forming the light converging layer between the adjacent sub-pixel units includes forming the light converging layer laterally surrounding the excitation light transmission layer, the target light transmission layer, and the target light conversion layer.

The beneficial effects of the application are as follows: the present invention provides a display panel and a method of manufacturing the same. The display panel includes a plurality of sub-pixel units, at least a portion of the sub-pixel units including an excitation light source for generating an excitation light; a target light conversion layer disposed in a light exiting direction of the excitation light source for converting the excitation light into a target light; and a target light transmission layer disposed in a light exiting direction of the target light conversion layer for transmitting the target light generated by the target light conversion layer and reflecting the excitation light passing through the target light conversion layer. By disposing the target light transmission layer on the target light conversion layer, only the target light of the target light conversion layer is transmitted, and the excitation light is reflected, thus enhancing the purity of the target light emitted by the sub-pixel units, thereby alleviating the defects such as low color saturation in the existing micro-display technology to a certain extent.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

The present invention is directed to the technical problems of the defects of the existing micro-display technology, and the embodiment of the present invention aims to solve the problems.

Figure 1:
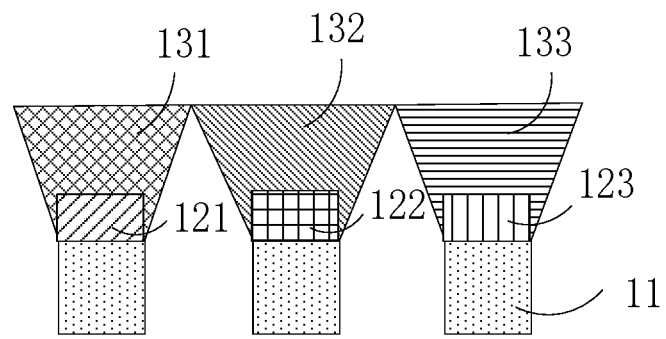
FIG. 1 is a schematic structural diagram of a display panel provided by the prior art.

As shown in FIG. 1, sub-pixel units in a conventional display panel include an excitation light source 11 and a light conversion layer, and the light conversion layer includes a red light conversion layer 121, a green light conversion layer 122, and a blue light conversion layer 123, wherein the excitation light source is a blue micro-light-emitting diode, and the excitation light emitted by the excitation light source is converted into light of a corresponding color through the light conversion layer. However, because part of the excitation light may pass through the light conversion layer, the emitted lights are a mixed light 131 of red light and blue light, a mixed light 132 of the green light and the blue light, and blue light 133, such that during display, the red light and the green light are not pure, resulting in insufficient color saturation of the display, and crosstalk occurs between the adjacent sub-pixel units of different colors, further worsening the problems. Therefore, the existing micro-display technology has defects.

Figure 2:
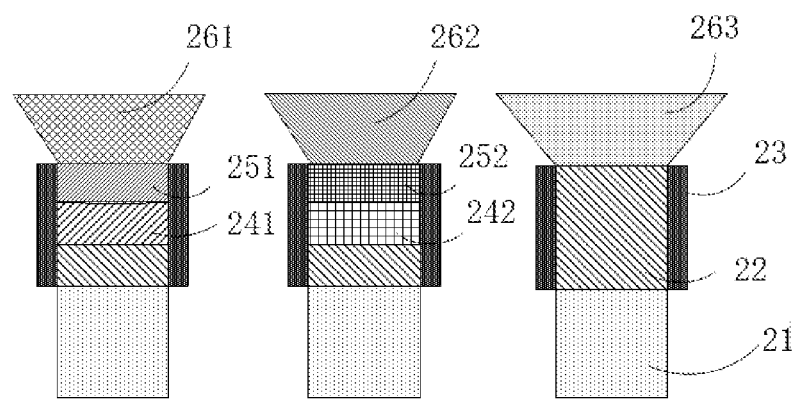
FIG. 2 is a first schematic structural diagram of a display panel according to an embodiment of the present invention.
Figure 3:
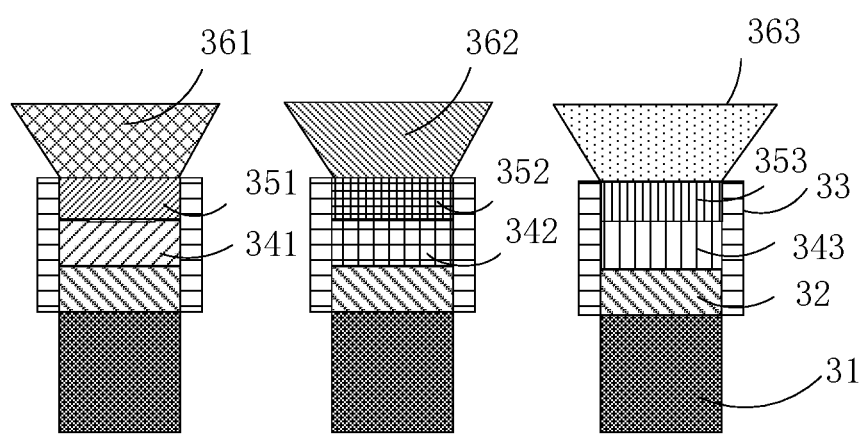
FIG. 3 is a second schematic structural diagram of a display panel according to an embodiment of the present invention.

As shown in FIG. 2 or FIG. 3, an embodiment of the present invention provides a display panel, including a plurality of sub-pixel units, and each of the sub-pixel units includes:

an excitation light source 21 for generating an excitation light;

a target light conversion layer 24 (including an element 241 and an element 242 in FIG. 2) disposed in a light exiting direction of the excitation light source for converting the excitation light into a target light; and a target light transmission layer 25 (including an element 251 and an element 252 in FIG. 2) disposed in a light exiting direction of the target light conversion layer for transmitting the target light generated by the target light conversion layer and reflecting the excitation light passing through the target light conversion layer.

In an embodiment, the target light transmission layer is formed on a light exiting surface of the target light conversion layer, and the excitation light passing through the target light conversion layer is reflected to the target light conversion layer.

In an embodiment, the display panel further includes an excitation light transmission layer disposed in a light exiting direction of the excitation light source between the excitation light source and the target light conversion layer.

In an embodiment, the excitation light transmission layer is formed on the light exiting surface of the excitation light source.

In an embodiment, the target light conversion layer is formed on the light exiting surface of the excitation light transmission layer.

In an embodiment, the excitation light transmission layer, the target light conversion layer, and the target light transmission layer have a total thickness of 200 nm to 500 nm.

In an embodiment, the display panel further includes a light converging layer disposed between the adjacent sub-pixel units for converging the target light emitted by the sub-pixel units.

In an embodiment, the light converging layer laterally surrounds the sub-pixel units.

In an embodiment, the light converging layer laterally surrounds the target light conversion layer and the target light transmission layer.

In an embodiment, the light converging layer laterally surrounds the excitation light transmission layer, the target light conversion layer, and the target light transmission layer.

This embodiment provides a display panel including a plurality of sub-pixel units, at least a portion of the sub-pixel units including an excitation light source for generating an excitation light; a target light conversion layer disposed in a light exiting direction of the excitation light source for converting the excitation light into a target light; and a target light transmission layer disposed in a light exiting direction of the target light conversion layer for transmitting the target light generated by the target light conversion layer and reflecting the excitation light passing through the target light conversion layer. By disposing the target light transmission layer on the target light conversion layer, only the target light of the target light conversion layer is transmitted, and the excitation light is reflected, thus enhancing the purity of the target light emitted by the sub-pixel units, thereby alleviating the defects, such as low color saturation in the existing micro-display technology to a certain extent.

In an embodiment, the excitation light generated by the excitation light source 21 is also one of the target lights (red, green, blue, white, or the like) of the sub-pixels. In such a case, the sub-pixels of the display panel are formed as shown in FIG. 2. Specifically, taking the excitation light source 21 as a blue light-emitting diode (LED) as an example, each of the sub-pixel units includes: an excitation light source 21, an excitation light transmission layer 22, a light converging layer 23, a target light conversion layer 24 (including the element 241 and the element 242 in FIG. 2), and a target light transmission layer 25 (including the element 251 and the element 252 in FIG. 2). The excitation light source is a blue excitation light source 21. The excitation light transmission layer is a blue light transmission layer 22. The target light conversion layer includes a red light conversion layer 241 and a green light conversion layer 242. The target light transmission layer includes a red light transmission layer 251 and a green light transmission layer 252.

In an embodiment, the blue light transmission layer 22 is disposed on a light exiting surface of the blue excitation light source 21, and the red light conversion layer 241 and the green light conversion layer 242 are correspondingly disposed on the light exiting surface of the blue light transmission layer 22. The red light transmission layer 251 is disposed on a light exiting surface of the red light conversion layer 241, and the green light transmission layer 252 is disposed on a light exiting surface of the green light conversion layer 242. The blue excitation light emitted from the blue excitation light source passes through the target light conversion layer, and the target light transmission layer to obtain red light 261, green light 262, and blue light 263.

In an embodiment, the excitation light source 21 may be any one of a blue light-emitting diode (LED), a red LED, a green LED, and a white LED.

In one embodiment, the excitation light generated by the excitation light source is not one of the target light colors (red, green, blue, white, etc.) of the sub-pixels. In such a case, the sub-pixels of the display panel are formed as shown in FIG. 3. Specifically, taking the excitation light source as a violet light-emitting diode (LED) as an example, each of the sub-pixel units includes: an excitation light source 31, an excitation light transmission layer 32, a light converging layer 33, a target light conversion layer, and a target light transmission layer. The excitation light source is a near ultraviolet excitation light source 31. The excitation light transmission layer is a near ultraviolet light transmission layer 32. The target light conversion layer includes a red light conversion layer 341, a green light conversion layer 342, and a blue light conversion layer 343. The target light transmission layer includes a red light transmission layer 351, a green light transmission layer 352, and a blue light transmission layer 353.

In an embodiment, the near ultraviolet light transmission layer 32 is disposed on a light exiting surface of the near ultraviolet excitation light source 31, and the red light conversion layer 341, the green light conversion layer 342, and the blue light conversion layer 343 are correspondingly disposed on the light exiting surface of the near ultraviolet light transmission layer 32. The red light transmission layer 351 is disposed on a light exiting surface of the red light conversion layer 341, the green light transmission layer 352 is disposed on a light exiting surface of the green light conversion layer 342, and the near ultraviolet light transmission layer 353 is disposed on a light exiting surface of the blue light conversion layer 343. The near ultraviolet excitation light emitted from the near ultraviolet excitation light source passes through the near ultraviolet light transmission layer, the target light conversion layer, and the target light transmission layer to obtain red light 361, green light 362, and blue light 363.

In this embodiment, the excitation light transmission layer is disposed on the excitation light source to increase the transmittance of the excitation light, and the target light transmission layer is disposed on the target light conversion layer. After the excitation light emitted from the excitation light source passes through the target light conversion layer, it is converted into a target light and the target light is mixed with the excitation light. When the mixed light passes through the target light transmission layer, the target light is emitted, and the excitation light is reflected, so that the obtained target light is mixed with less excitation light or even without excitation light. As such, the obtained target light is relatively pure, thereby improving the color saturation of the display and alleviating the defects of the micro-display technology.

In an embodiment, the excitation light is reflected when passing through the target light transmission layer, and then the excitation light can be converted into the target light to be emitted again by re-exciting the target light conversion layer. The excitation light transmission layer effectively prevents the color mixing of the target light converted from the reflected excitation light and the excitation light emitted by the excitation light source, which may negatively affect the purity of the excitation light. In addition, because the excitation light may re-excite the target light conversion layer to be emitted as the target light, a thickness of the target light conversion layer can be reduced. For example, the total thickness of the excitation light transmission layer, the target light conversion layer, and the target light transmission layer is 200 nm to 500 nm, thus reducing the thickness and the cost.

In an embodiment, the target light is reflected and the excitation light is reflected by adjusting the transmittance of the target light transmission layer. For example, the red light transmission layer is adjusted to have a transmission wavelength of red light wavelength, thereby reflecting the blue excitation light. As such, the emitted target light is purer, improving the color saturation and display quality.

In an embodiment, a light converging layer is disposed to surround the sub-pixel units, and a crosstalk of the target lights between the adjacent sub-pixel units can be prevented by introducing the light converging layer, which effectively prevents an exit angle of the target light from being excessively large, and the purity of the target light is improved.

In an embodiment, the light converging layer laterally surrounds the target light conversion layer and the target light transmission layer.

In an embodiment, the light converging layer laterally surrounds the excitation light transmission layer, the target light conversion layer, and the target light transmission layer, and the crosstalk of the adjacent sub-pixel units can be prevented by introducing the light converging layer, and the excitation light emitted by the target light transmission layer can be converged to the target light conversion layer, further reducing the thickness of the target light conversion layer.

In an embodiment, the adjacent sub-pixel units may adopt the same light converging layer, or each sub-pixel units is provided with a light converging layer on a side thereof. A height of the light converging layer may be increased to different degrees for different arrangements to prevent the crosstalk between the adjacent sub-pixel units, thereby improving the purity of the target light and alleviating the defects of the existing micro-display technology.

Figure 4:
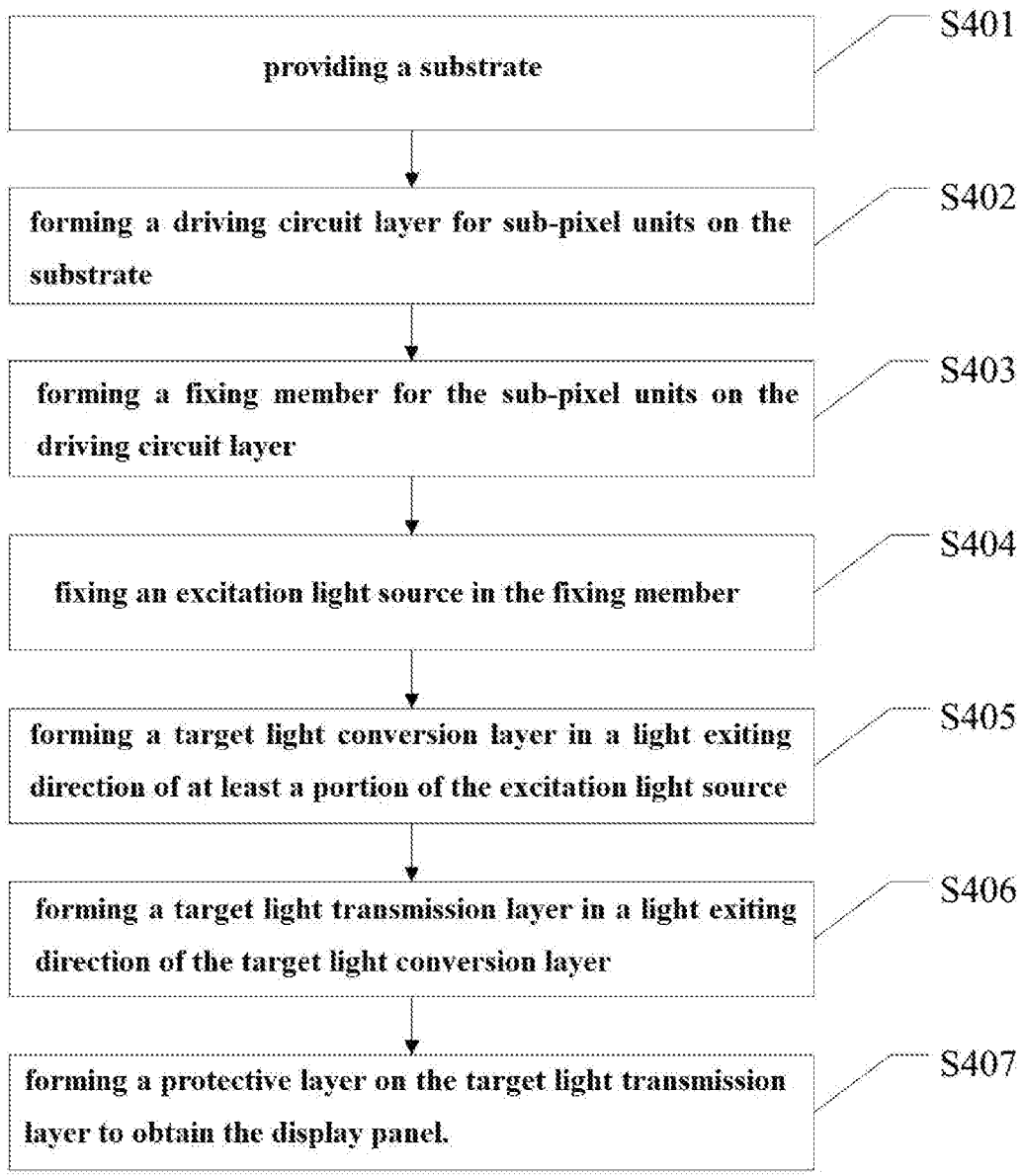
FIG. 4 is a flowchart of a method of manufacturing a display panel according to an embodiment of the present invention.

In order to manufacture the display panel, another embodiment of the present invention further provides a method of manufacturing a display panel. As shown in FIG. 4, this embodiment provides a method of manufacturing a display panel, including the following steps:

S401, providing a substrate;

S402, forming a driving circuit layer for sub-pixel units on the substrate;

S403, forming a fixing member, such as a groove or the like, for the sub-pixel units on the driving circuit layer;

S404, fixing an excitation light source for generating an excitation light in the fixing member;

S405, forming a target light conversion layer in a light exiting direction of at least a portion of the excitation light source for converting the excitation light into a target light;

S406, forming a target light transmission layer in a light exiting direction of the target light conversion layer for transmitting the target light generated by the light conversion layer and reflecting the excitation light passing through the target light conversion layer; and S407, forming a protective layer on the target light transmission layer to obtain the display panel.

In an embodiment, the step of forming a target light transmission layer in the light exiting direction of the target light conversion layer includes: forming a target light transmission layer on a light exiting surface of the target light conversion layer.

In an embodiment, the method of manufacturing the display panel shown in FIG. 4 further includes: forming an excitation light transmission layer in a light exiting direction of the excitation light source.

In an embodiment, the step of forming an excitation light transmission layer in a light exiting direction of the excitation light source includes: forming an excitation light transmission layer on a light exiting surface of the excitation light source.

In an embodiment, the method of manufacturing the display panel of FIG. 4 further includes: forming a target light conversion layer on a light exiting surface of the excitation light transmission layer.

In an embodiment, the step of forming an excitation light transmission layer in the light exiting direction of the excitation light source includes: forming the excitation light transmission layer by depositing an inorganic material on the light exiting surface of the excitation light source by evaporation.

In an embodiment, the method of manufacturing the display panel shown in FIG. 4 further includes: forming a light converging layer between the adjacent sub-pixel units, wherein the light converging layer is used for converging light emitted by the sub-pixel units.

In an embodiment, the step of forming a light converging layer between the adjacent sub-pixel units includes: forming the light converging layer laterally surrounding the sub-pixel units.

In an embodiment, the step of forming a light converging layer between the adjacent sub-pixel units includes: forming the light converging layer laterally surrounding the target light conversion layer and the target light transmission layer.

In an embodiment, the step of forming a light converging layer between the adjacent sub-pixel units includes: forming the light converging layer laterally surrounding the excitation light transmission layer, the target light conversion layer, and the target light transmission layer.

This embodiment provides a method of manufacturing the display panel. The display panel obtained by the method includes a plurality of sub-pixel units, at least a portion of the sub-pixel units including an excitation light source for generating an excitation light; a target light conversion layer disposed in a light exiting direction of the excitation light source for converting the excitation light into a target light; and a target light transmission layer disposed in a light exiting direction of the target light conversion layer for transmitting the target light generated by the target light conversion layer and reflecting the excitation light passing through the target light conversion layer. By disposing the target light transmission layer on the target light conversion layer, only the target light of the target light conversion layer is transmitted, and the excitation light is reflected, thus enhancing the purity of the target light emitted by the sub-pixel units, thereby alleviating the defects, such as low color saturation in the existing micro-display technology, to a certain extent.

The manufacturing method of the present invention will now be described by taking a blue light-emitting diode (LED) as the excitation light source as an example. The embodiment of the present invention provides a method of manufacturing a display panel, including the following steps.

Figure 5:
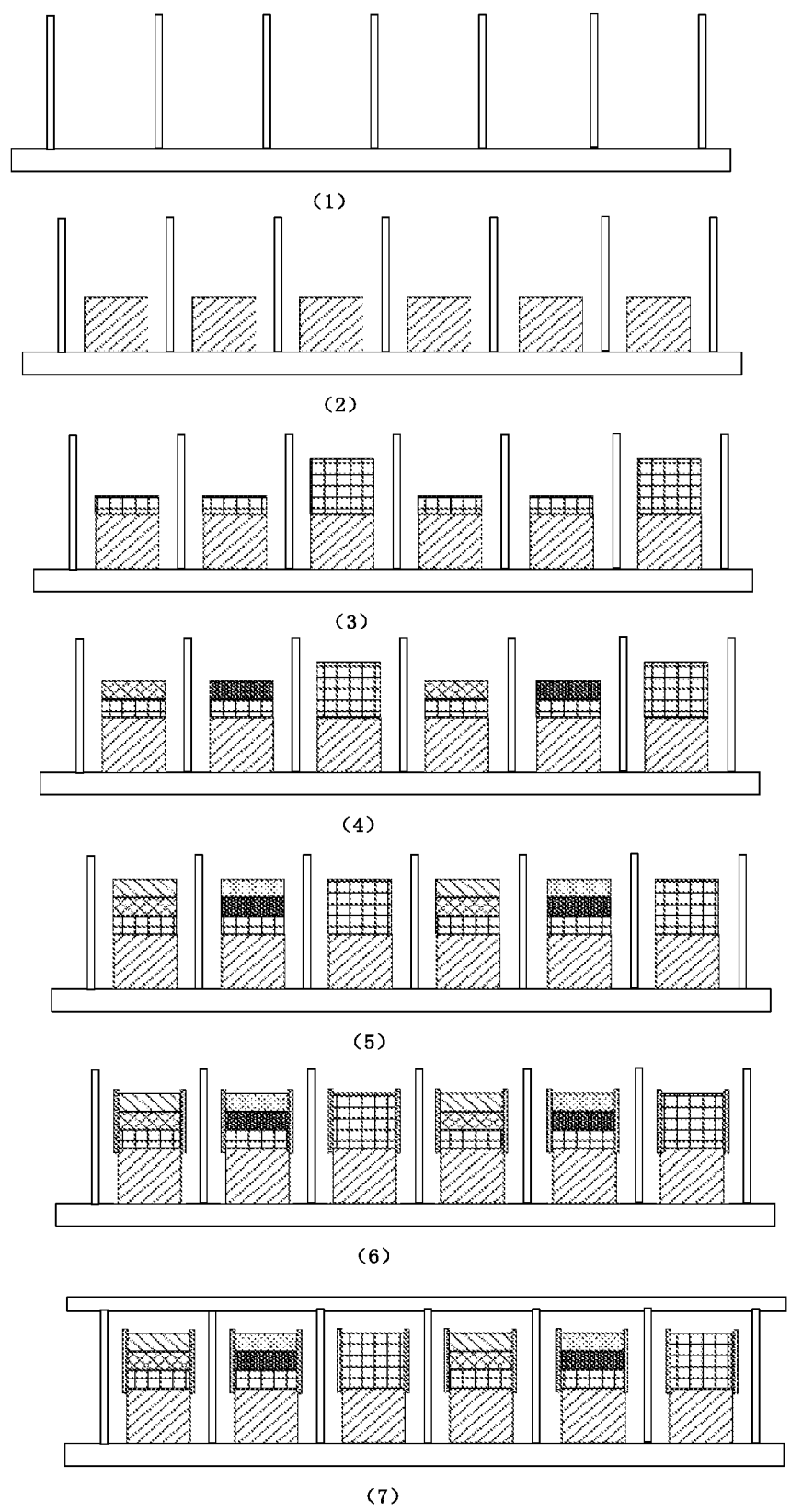
FIG. 5 is a first schematic diagram of a process for manufacturing a display panel according to an embodiment of the present invention.

Step 51, forming fixing grooves corresponding to the sub-pixels on the substrate, to fix the blue LED as the excitation light source, and the fixed structure is as shown in FIG. 5(1).

Step 52, fixing the fixed blue LED in the fixing groove as the excitation light source, that is, in positions corresponding to all the sub-pixels on the substrate, and the fixed structure is as shown in FIG. 5(2).

Step 53, using a mask or the like, to form an excitation light transmission layer on positions corresponding to the sub-pixels on the substrate, that is, forming a blue light transmission layer on the light exiting surface of the blue excitation light source, wherein the blue light transmission layer has a larger thickness corresponding to the blue sub-pixels than those corresponding to the red sub-pixels and the green sub-pixels, and the effect is as shown in FIG. 5(3).

Step 54: forming a target light conversion layer on positions corresponding to the target sub-pixels, that is, forming a red light conversion layer on the light exiting surface of the blue light transmission layer corresponding to the red sub-pixels, while forming a green light conversion layer on the light exiting surface of the blue light transmission layer corresponding to the green sub-pixels, and the effect is as shown in FIG. 5(4).

Step 55, forming a target light transmission layer on positions corresponding to the target sub-pixels, that is, forming a red light transmission layer on the light exiting surface of the red light conversion layer corresponding to the red light sub-pixels, while forming a green light transmission layer on the light exiting surface of the green light conversion layer corresponding to the green light sub-pixels, and the effect is as shown in FIG. 5(5).

Step 56, forming a light converging layer laterally surrounding all the sub-pixels, that is, forming a light converging layer laterally surrounding each of the sub-pixels, and the effect is as shown in FIG. 5(6).

Step 57, forming a protective layer on the substrate, that is, forming a protective layer on the target light transmission layer to obtain the display panel, and the effect is as shown in FIG. 5(7).

The manufacturing method of the present invention will now be described by taking a violet LED as the excitation light source as an example. The embodiment of the present invention provides a method of manufacturing a display panel, including the following steps.

Figure 6:
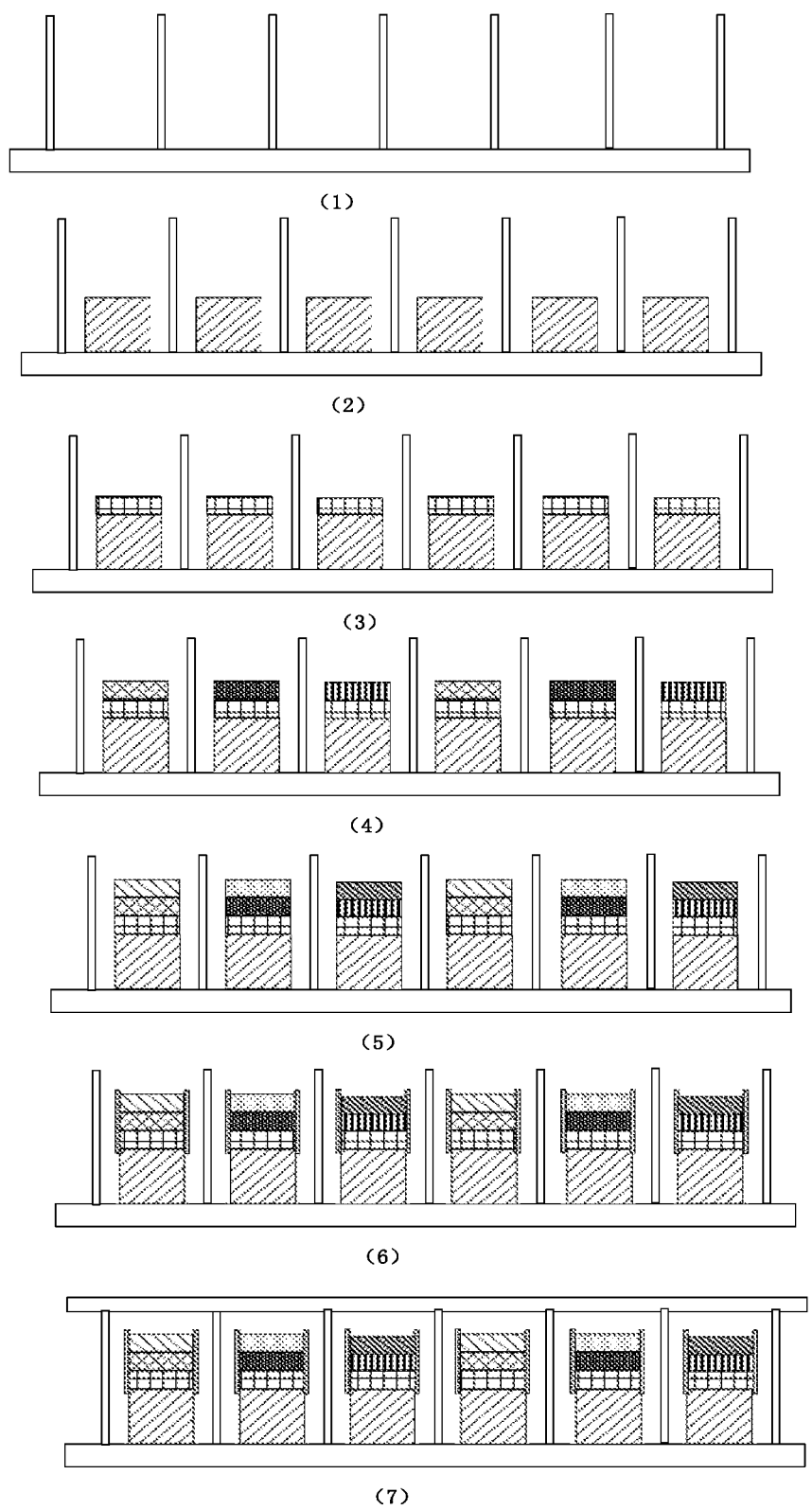
FIG. 6 is a second schematic diagram of a process for manufacturing a display panel according to an embodiment of the present invention.

Step 61, forming fixing grooves corresponding to the sub-pixels on the substrate, to fix the violet LED as the excitation light source, and the fixed structure is as shown in FIG. 6(1).

Step 62, fixing the fixed violet LED in the fixing groove as the excitation light source, that is, in positions corresponding to all the sub-pixels on the substrate, and the fixed structure is as shown in FIG. 6(2).

Step 63, using a mask or the like, to form an excitation light transmission layer on positions corresponding to the sub-pixels on the substrate, that is, forming a violet light transmission layer on the light exiting surface of the violet excitation light source, and the effect is as shown in FIG. 6(3).

Step 64: forming a target light conversion layer on positions corresponding to the target sub-pixels, that is, forming a red light conversion layer on the light exiting surface of the violet light transmission layer corresponding to the red sub-pixels, forming a green light conversion layer on the light exiting surface of the violet light transmission layer corresponding to the green sub-pixels, while forming a blue light conversion layer on the light exiting surface of the violet light transmission layer corresponding to the blue sub-pixels, and the effect is as shown in FIG. 6(4).

Step 65, forming a target light transmission layer on positions corresponding to the target sub-pixels, that is, forming a red light transmission layer on the light exiting surface of the red light conversion layer corresponding to the red light sub-pixels, forming a green light transmission layer on the light exiting surface of the green light conversion layer corresponding to the green light sub-pixels, while forming a blue light transmission layer on the light exiting surface of the blue light conversion layer corresponding to the blue light sub-pixels, and the effect is as shown in FIG. 6(5).

Step 66, forming a light converging layer laterally surrounding all the sub-pixels, that is, forming a light converging layer laterally surrounding each of the sub-pixels, and the effect is as shown in FIG. 6(6).

Step 67, forming a protective layer on the substrate, that is, forming a protective layer on the target light transmission layer to obtain the display panel, and the effect is as shown in FIG. 6(7).

In an embodiment, when the excitation light source is provided, a blue excitation light source, a green excitation light source, and a red excitation light source may be selected. For different excitation light sources, the corresponding sub-pixel units may be filled with a transparent material without a target light conversion layer. The target light without mixing with other colors can be obtained, and the other target lights can be screened to be the target light of a purer color or even an absolutely pure color after passing through the corresponding target light conversion layer and the target light transmission layer. The near-ultraviolet excitation light source also can be used, and as long as the light transmission layer, the target light-conversion layer is changed correspondingly, and the target light transmission layer can be introduced correspondingly to obtain the target light of a purer color or even an absolutely pure color.

In an embodiment, a groove may be formed by drilling for setting a sub-pixel, and a light converging layer is manufactured around each of the sub-pixels to prevent an exit angle of the target light from being excessively large, and to shaping the target light to prevent a crosstalk of the target lights between the adjacent sub-pixel units, thereby improving display quality. In addition, the light converging layer can be formed between adjacent sub-pixels such that the adjacent sub-pixel units can share the light converging layer. By increasing the height of the light converging layer, crosstalk of the sub-pixels can be effectively prevented to improve the purity of the target light and improve the display quality.

In an embodiment, the excitation light transmission layer may be formed on the light exiting surface of the excitation light source by means of evaporation or magnetron sputtering of the inorganic material. Alternatively, the excitation light transmission layer may be formed on the light exiting surface of the excitation light source by hot-pressing an organic material. The inorganic material includes titanium dioxide, aluminum oxide, silicon dioxide, and zinc sulfide, etc., and the organic material includes polyethylene terephthalate (PET), polymethyl methacrylate (PMMA), and a resin, etc. In the embodiment of the present invention, the target light conversion layer may be formed by evaporating quantum dots or phosphors, and the light converging layer can be made of resin, silica gel, or other conductive medium.

According to the above embodiment, it can be known that:

Embodiments of the present invention provide a display panel and a method of manufacturing the same. The display panel includes a plurality of sub-pixel units, at least a portion of the sub-pixel units including an excitation light source for generating an excitation light; a target light conversion layer disposed in a light exiting direction of the excitation light source for converting the excitation light into a target light; and a target light transmission layer disposed in a light exiting direction of the target light conversion layer for transmitting the target light generated by the target light conversion layer and reflecting the excitation light passing through the target light conversion layer. As such, the target light emitted by the sub-pixel units is mixed with a small amount of excitation light or even without excitation light, so that the target light emitted by the sub-pixel units is relatively pure, thereby solving the technical problem that the existing micro-display technology has defects. Because the excitation light is reflected back to the target light conversion layer by the target light transmission layer, it is converted into the target light again, so that a thickness of the color conversion layer is reduced, thus saving cost. The light converging layer surrounding the sub-pixels effectively prevents the crosstalk between the sub-pixel units, and helps reduce the thickness of the target light conversion layer.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising a plurality of sub-pixel units, at least a portion of the sub-pixel units comprising:
   an excitation light source for generating excitation light;
   a target light conversion layer disposed in a light exiting direction of the excitation light source for converting the excitation light into a target light; and
   a target light transmission layer disposed directly above the target light conversion layer and disposed in a light exiting direction of the target light conversion layer for transmitting the target light generated by the target light conversion layer and reflecting the excitation light passing through the target light conversion layer.

2. The display panel according to claim 1, wherein the target light transmission layer is formed on a light exiting surface of the target light conversion layer, and the excitation light passing through the target light conversion layer is reflected to the target light conversion layer.

3. The display panel according to claim 1, further comprising an excitation light transmission layer, wherein the excitation light transmission layer is disposed in the light exiting direction of the excitation light source and is disposed between the excitation light source and the target light conversion layer.

4. The display panel according to claim 3, wherein the excitation light transmission layer is formed on a light exiting surface of the excitation light source.

5. The display panel according to claim 3, wherein the target light conversion layer is formed on a light exiting surface of the excitation light transmission layer.

6. The display panel according to claim 1, wherein the excitation light transmission layer, the target light conversion layer, and the target light transmission layer have a total thickness of 200 nm to 500 nm.

7. The display panel according to claim 3, further comprising a light converging layer disposed between the adjacent sub-pixel units for converging the target light emitted by the sub-pixel units.

8. The display panel according to claim 7, wherein the light converging layer laterally surrounds the sub-pixel units.

9. The display panel according to claim 7, wherein the light converging layer laterally surrounds the target light conversion layer and the target light transmission layer.

10. The display panel according to claim 7, wherein the light converging layer laterally surrounds the excitation light transmission layer, the target light conversion layer, and the target light transmission layer.

11. A method of manufacturing the display panel according to claim 1, comprising:
    providing the substrate;
    forming the driving circuit layer for sub-pixel units on the substrate;
    forming the fixing member for the sub-pixel units on the driving circuit layer;
    fixing the excitation light source for generating the excitation light in the fixing member;
    forming the target light conversion layer in the light exiting direction of at least a portion of the excitation light source for converting the excitation light into the target light;
    forming the target light transmission layer in the light exiting direction of the target light conversion layer for transmitting the target light generated by the light conversion layer and reflecting the excitation light passing through the target light conversion layer; and
    forming the protective layer on the target light transmission layer to obtain the display panel.

12. The method of manufacturing the display panel according to claim 11, wherein the step of forming the target light transmission layer in the light exiting direction of the target light conversion layer comprises forming a target light transmission layer on a light exiting surface of the target light conversion layer.

13. The method of manufacturing a display panel according to claim 11, further comprising forming an excitation light transmission layer in a light exiting direction of the excitation light source.

14. The method of manufacturing the display panel according to claim 13, wherein the step of forming the excitation light transmission layer in the light exiting direction of the excitation light source comprises forming the excitation light transmission on a light exiting surface of the excitation light source.

15. The method of manufacturing the display panel according to claim 13, further comprising forming the target light conversion layer on a light-emitting surface of the excitation light transmission layer.

16. The method of manufacturing the display panel according to claim 13, wherein the step of forming the excitation light transmission layer in the light exiting direction of the excitation light source comprises: forming the excitation light transmission layer by depositing an inorganic material on the light exiting surface of the excitation light source by evaporation.

17. The method of manufacturing the display panel according to claim 13, further comprising forming a light converging layer between adjacent sub-pixel units for converging light emitted by the sub-pixel units.

18. The method of manufacturing the display panel according to claim 17, wherein the step of forming the light converging layer between adjacent sub-pixel units comprises forming the light converging layer laterally surrounding the sub-pixel units.

19. The method of manufacturing the display panel according to claim 17, wherein the step of forming the light converging layer between the adjacent sub-pixel units comprises forming the light converging layer laterally surrounding the target light conversion layer and the target light transmission layer.

20. The method of manufacturing the display panel according to claim 17, wherein the step of forming the light converging layer between the adjacent sub-pixel units comprises forming the light converging layer laterally surrounding the excitation light transmission layer, the target light transmission layer, and the target light conversion layer.

* * * * *